United States Patent
Campbell

(10) Patent No.: US 8,988,161 B2
(45) Date of Patent: Mar. 24, 2015

(54) TRANSFORMER FOR MONOLITHIC MICROWAVE INTEGRATED CIRCUITS

(71) Applicant: TriQuint Semiconductor, Inc., Hillsboro, OR (US)

(72) Inventor: Charles F. Campbell, McKinney, TX (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 93 days.

(21) Appl. No.: 13/929,301

(22) Filed: Jun. 27, 2013

(65) Prior Publication Data

US 2014/0375387 A1 Dec. 25, 2014

Related U.S. Application Data

(60) Provisional application No. 61/837,610, filed on Jun. 20, 2013.

(51) Int. Cl.
*H03H 7/38* (2006.01)
*H03F 3/16* (2006.01)
*H03H 3/00* (2006.01)

(52) U.S. Cl.
CPC . *H03H 7/38* (2013.01); *H03F 3/16* (2013.01); *H03H 3/00* (2013.01)
USPC ............ 333/33; 333/32; 333/35; 333/25; 333/26; 333/24 R; 336/180; 336/182; 336/184; 336/186; 336/187

(58) Field of Classification Search
USPC ............ 336/186, 187, 200, 180, 182, 184; 333/33, 32, 35, 25, 26, 24 R
See application file for complete search history.

(56) References Cited

U.S. PATENT DOCUMENTS

| | | | |
|---|---|---|---|
| 5,804,877 A | 9/1998 | Fuller | |
| 6,191,021 B1 | 2/2001 | Fuller | |
| 6,407,647 B1 | 6/2002 | Apel | |
| 6,437,658 B1 | 8/2002 | Apel | |
| 6,806,558 B2 | 10/2004 | Apel | |
| 6,882,240 B2 | 4/2005 | Apel | |
| 8,558,638 B2 * | 10/2013 | Masuda | ..................... 333/33 |

(Continued)

OTHER PUBLICATIONS

Ang, Kain Sen, et al.; "A Broad-Band Quarter-Wavelength Impedance Transformer with Three Reflection Zeros within Passband;" IEEE Transactions on Microwave Theory and Techniques, vol. 52, No. 12, Dec. 2004.

*Primary Examiner* — Adam Houston
(74) *Attorney, Agent, or Firm* — Schwabe Williamson & Wyatt

(57) ABSTRACT

Various embodiments may provide a monolithic transformer for a radio frequency (RF) power amplifier module, such as a microwave frequency power amplifier module. The transformer may include a plurality of pairs of edge-coupled transmission lines, with individual pairs including first and second edge-coupled transmission lines. The first transmission lines may include first ends coupled with one another and second ends coupled with an input terminal of the transformer. The second transmission lines may include first ends coupled with the input terminal and second ends coupled with an output terminal of the transformer. The transformer may pass a communication signal from the input terminal to the output terminal, and provide a first impedance at the input terminal and a second impedance at the output terminal. The second impedance may be higher than the first impedance (e.g., by a factor of four).

22 Claims, 5 Drawing Sheets

(56) References Cited

U.S. PATENT DOCUMENTS

| | | | |
|---|---|---|---|
| 2003/0193079 A1* | 10/2003 | Apel | 257/664 |
| 2004/0113239 A1* | 6/2004 | Prokofiev et al. | 257/662 |
| 2009/0309659 A1* | 12/2009 | Lender et al. | 330/277 |
| 2010/0188056 A1* | 7/2010 | Steinbrecher | 323/222 |
| 2010/0297968 A1* | 11/2010 | Leong | 455/127.1 |
| 2011/0103267 A1* | 5/2011 | Devuyst et al. | 370/276 |
| 2012/0081182 A1* | 4/2012 | Lender et al. | 330/286 |
| 2012/0206215 A1* | 8/2012 | Winslow | 333/33 |
| 2012/0268230 A1* | 10/2012 | Kim et al. | 336/200 |
| 2012/0274434 A1* | 11/2012 | Lim et al. | 336/200 |
| 2013/0043968 A1* | 2/2013 | Cho | 336/200 |
| 2013/0094802 A1* | 4/2013 | Azadeh | 385/15 |
| 2013/0234794 A1* | 9/2013 | Takagi | 330/250 |
| 2013/0260703 A1* | 10/2013 | Actis et al. | 455/127.2 |
| 2014/0328231 A1* | 11/2014 | Devuyst et al. | 370/295 |

\* cited by examiner

TRANSFORMER FOR MONOLITHIC MICROWAVE INTEGRATED CIRCUITS

CROSS REFERENCE TO RELATED APPLICATIONS

The present application claims priority to U.S. Provisional Patent Application No. 61/837,610, filed on Jun. 20, 2013, and titled "TRANSFORMER FOR MONOLITHIC MICROWAVE INTEGRATED CIRCUITS," the entire disclosure of which is hereby incorporated by reference.

FIELD

Embodiments of the present disclosure relate generally to the field of circuits, and more particularly to a transformer for monolithic microwave integrated circuits.

BACKGROUND

Wideband distributed power amplifiers are used in many electronic communication systems. Wideband distributed power amplifiers include a plurality of transistors with a first electrical path connecting the inputs of the transistors and the second electrical path connecting the outputs of the transistors. The first and second electrical paths include characteristic impedances between the inputs and outputs, respectively, of the transistors. However, the total useable transistor periphery of the distributed power amplifier is limited by the load impedance. Additionally, for a load impedance of 50 Ohms, some of the characteristic impedances are too high to be realized or to support the required bias current for the transistors. Furthermore, it is difficult to realize a high current wideband drain bias choke.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "A/B" and "A and/or B" mean (A), (B), or (A and B); and the phrase "A, B, and/or C" means (A), (B), (C), (A and B), (A and C), (B and C) or (A, B and C).

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

Figure 1A:
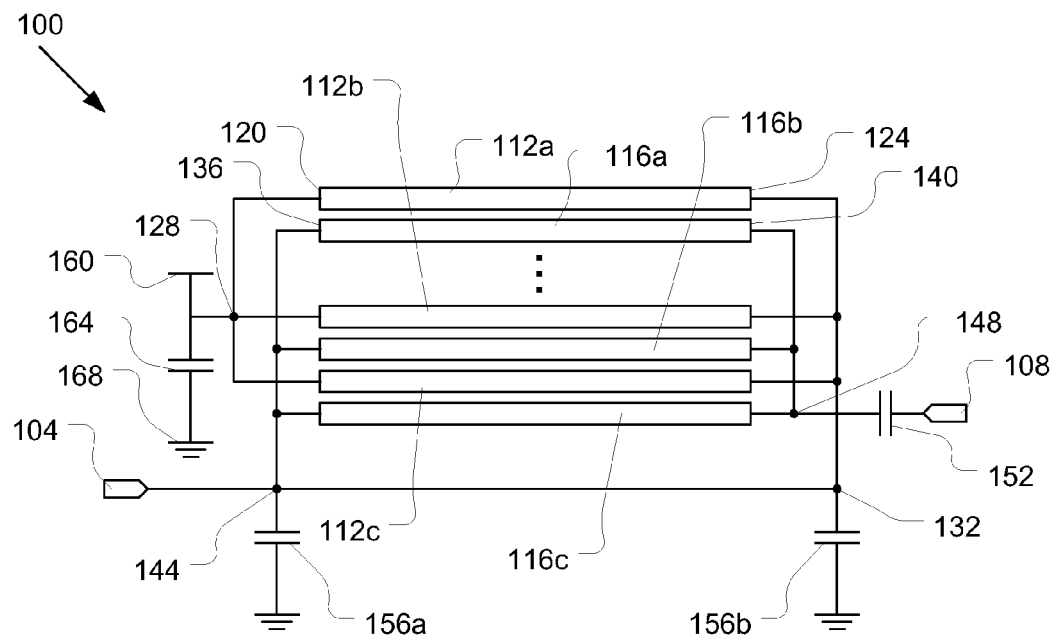
FIG. 1A schematically illustrates a transformer including a plurality of pairs of edge-coupled transmission lines, in accordance with various embodiments.

FIG. 1A illustrates a transformer 100 in accordance with various embodiments. Transformer 100 may include an input terminal 104 to receive a communication signal. The transformer 100 may further include an output terminal 108. In various embodiments, the transformer 100 may pass the communication signal to the output terminal 108. Additionally, the transformer 100 may provide the input terminal 104 with a first impedance, and the output terminal 108 with a second impedance that is different from the first impedance. For example, in some embodiments, the second impedance may be higher than the first impedance (e.g., by a factor of four).

Figure 2:
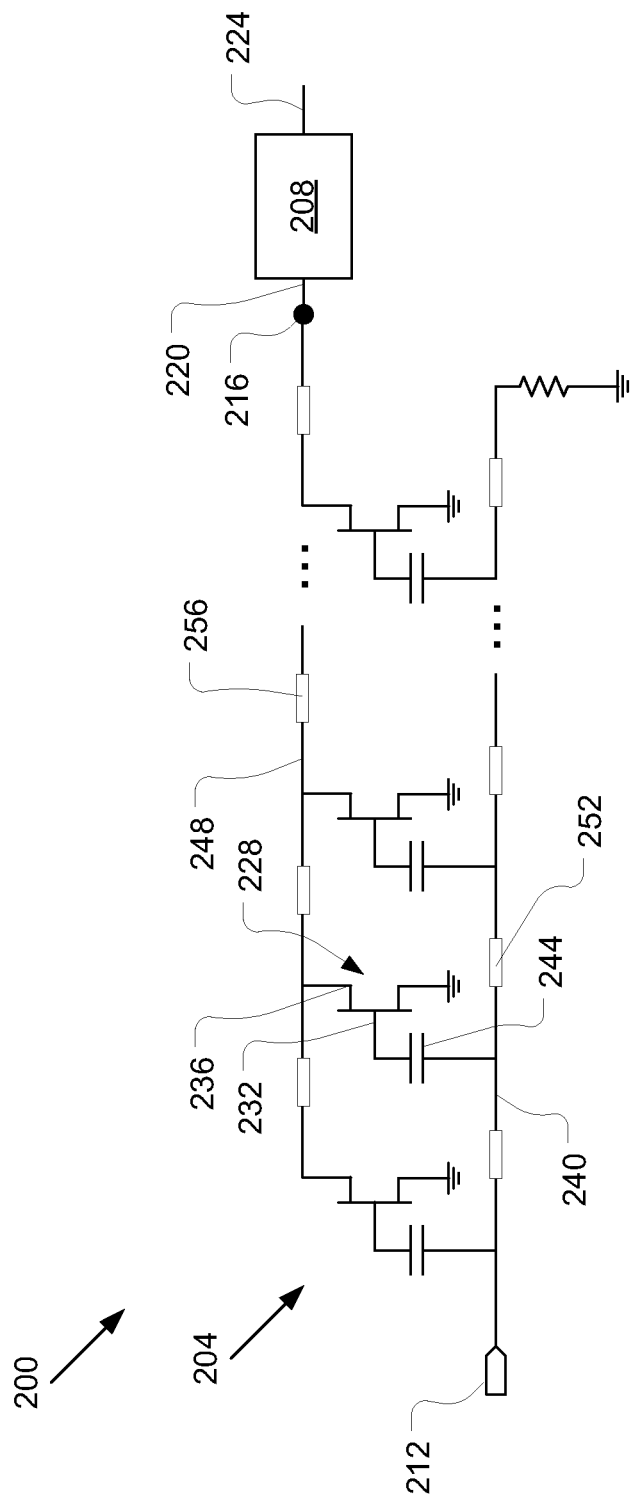
FIG. 2 schematically illustrates a power amplifier module including a distributed amplifier coupled with a transformer, in accordance with various embodiments.

In some embodiments, the communication signal may be a radio frequency (RF) signal, such as a microwave frequency signal. A microwave frequency signal may generally have a frequency of about 300 MegaHertz (MHz) to 300 GigaHertz (GHz)). In some embodiments, the communication signal may be provided to the input terminal 104 of the transformer by an RF power amplifier, such as a distributed RF power amplifier as shown in FIG. 2 and further discussed below.

In various embodiments, the transformer 100 may be a monolithic transformer disposed on a die. For example, the transformer 100 may be included in a monolithic microwave integrated circuit (MMIC). The MMIC may include one or more other components, such as one or more RF (e.g., microwave frequency) amplifiers. In some embodiments, the die may include a Gallium Nitride (GaN) substrate, although other substrates may be used in other embodiments.

In various embodiments, the transformer 100 may include a plurality of pairs of edge coupled transmission lines 112a-c and 116a-c. The individual pairs of transmission lines may include a first transmission line 112a-c and a second transmission line 116a-c. The plurality of pairs of edge coupled transmission lines 112a-c and 116a-c may pass the communication signal from the input terminal 104 to the output terminal 108, and transform the first impedance at the input terminal 104 to the second impedance at the output terminal 108.

In various embodiments, the transmission lines 112a-c and 116a-c may be formed of a thin film strip of a conductor disposed on the die. For example, the transmission lines 112a-c and 116a-c may have a substantially rectangular shape. By edge-coupled, it is meant that the transmission lines 112a-c and 116a-c are disposed in the same plane, with the long edges of the transmission lines 112a-c and 116a-c facing one another (e.g., oriented parallel with one another).

Edge-coupled transmission lines are in contrast to broadside-coupled transmission lines, in which the transmission lines are oriented with their largest faces (e.g., top or bottom faces) facing one another. Broadside-coupled transmission lines are typically accomplished by placing the transmission lines in different planes, with one transmission line on top of the other and an intervening layer in between the transmission lines.

Figure 1B:
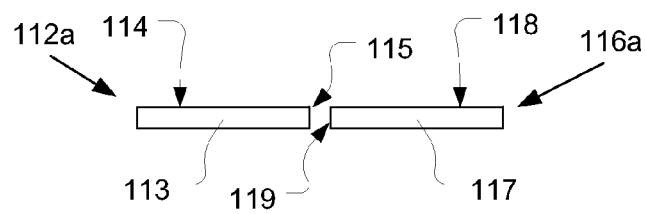
FIG. 1B schematically illustrates an end-side view of a pair of edge-coupled transmission lines of the transformer of FIG. 1A, in accordance with various embodiments.

For example, FIG. 1B illustrates an end-side view of transmission lines 112a and 116a as viewed from the first ends 120 and 136. Transmission line 112a may include an end surface 113, a broadside surface 114 and an edge surface 115. The broadside surface 114 may have a larger area than the edge surface 115, and the edge surface 115 may have a larger area than the end surface 113. Transmission line 116a may include an end surface 117, a broadside surface 118, and an edge surface 119. The broadside surface 118 may have a larger area than the edge surface 119, and the edge surface 119 may have a larger area than the end surface 117. The transmission lines 112a and 116a are edge-coupled, because the edge surfaces 115 and 119 are facing one another (and in close proximity to one another). In contrast, if the broadside surfaces 114 and 118 were facing one another, the transmission lines 112a and 116a would be broadside coupled.

However, broadside-coupled transmission lines are difficult to implement in MMICs. For example, MMIC metal layers may be separated by a thin nitride layer and may be too tightly coupled to be used as broadside coupled lines. Additionally, design rules governing the width and length limit of an airbridge (e.g., layer disposed above a main layer of the die) limit the availability of an airbridge to realize broadside-coupled transmission lines in an MMIC. Furthermore, an underpass (e.g., layer disposed below a main layer of the die) typically is thinner and has significantly less current carrying capability than the main layer. Accordingly, the termination element 100 may include a plurality of pairs of edge coupled transmission lines 112a-c and 116a-c, and no broadside-coupled transmission lines.

In various embodiments, the individual first transmission lines 112a-c may include a first end 120 and a second end 124, opposite the first end 120. The first ends 120 of the first transmission lines 112a-c may be coupled with one another at a node 128. Additionally, the first ends 120 may not be coupled to the input terminal 104 or the output terminal 108. Accordingly, a short circuit may be formed between the first ends 120 of the first transmission lines 112a-c. The second ends 124 of the first transmission lines 112a-c may be coupled with the input terminal 104 (e.g., via a node 132).

In various embodiments, the individual second transmission lines 116a-c may include a first end 136 and a second end 140. The first ends 136 of the second transmission lines 116a-c may be coupled with the input terminal 104 (e.g., via a node 144). The second ends 140 of the second transmission lines 116a-c may be coupled with the output terminal 108 (e.g., via a node 148) to pass the communication signal to the output terminal 108 and provide the output terminal 108 with the second impedance. A direct current (DC)-blocking capacitor 152 may be coupled between the second ends 140 of the second transmission lines 116a-c and the output terminal 108 to prevent DC signals from reaching the output terminal 108.

The plurality of pairs of edge-coupled transmission lines 112a-c and 116a-c may provide a 4:1 impedance transformation between the output terminal 108 and the input terminal 104. For example, in one embodiment, the first impedance at the input terminal 104 may be 12.5 Ohms, and the second impedance at the output terminal 108 may be 50 Ohms. This may allow the RF power amplifier to drive a load with the first impedance, while presenting the second impedance to other components in the transmit chain (e.g., an antenna switch or antenna structure). The lower value of the first impedance may allow the RF power amplifier to operate at higher power.

In some embodiments, the electrical connections between ends of the transmission lines 112a-c and 116a-c may be formed in one or more layers of the die on a different plane from the plane of the transmission lines 112a-c and 116a-c. For example, the electrical connections may be formed by one or more airbridges and/or underpasses.

In various embodiments, the transformer 100 may include any suitable number of pairs of transmission lines 112a-c and 116a-c, such as two or more pairs. The current handling (e.g., DC current handling) of the transformer 100 may be based on the number of pairs of edge-coupled transmission lines 112a-c and 116a-c included in the transformer 100. Accordingly, the transformer 100 may be scaled to allow for higher DC currents by adding pairs of transmission lines 112a-c and 116a-c.

Additionally, a frequency response of the transformer 100 may be based on a length of the transmission lines 112a-c and 116a-c. For example, the transformer 100 may be suitable for operation over a range of frequencies distributed around a center frequency. That is, the transformer 100 may have sufficient inductive coupling between the pairs of transmission lines 112a-c and 116a-c over the range of frequencies to pass the communication signal without significant power loss and to provide the impedance transformation. Accordingly, the length of the transmission lines 112a-c and 116a-c may be determined based on a frequency range of the communication signals to be handled by the transformer 100. For example, the transmission lines 112a-c and 116a-c may have a relatively shorter length to handle higher frequencies, or a longer length for lower frequencies. As an example, in some embodiments, the transformer 100 may be designed to operate in the C-band (about 4 to 8 GHz) and/or X-band (about 8 to 12 GHz). In other embodiments, the transformer 100 may be designed to operate in frequencies from about 6 to 18 GHz. Other frequencies ranges for the transformer 100 may be provided in other embodiments.

In some embodiments, the transformer 100 may further include one or more tuning capacitors 156a-b coupled with the input terminal 104 (e.g., the tuning capacitors 156a-b may be coupled with the second ends 124 of the first transmission lines 112a-c and/or the first ends 136 of the second transmission lines 116a-c. The tuning capacitors 156a-b may facilitate operation of the transformer 100 at high frequencies (e.g., frequencies above about 12 GHz). For example, the tuning capacitors 156a-b may provide some shunt capacitance to balance the inductance provided by the transmission lines 112a-c and 116a-c at higher frequencies. In other embodiments, the transformer 100 may not include the tuning capacitors 156a-b, such as when the transformer 100 is designed for lower frequency operation (e.g., frequencies below about 12 GHz, such as C-band and/or X-band operation).

In some embodiments, the transformer 100 may further include a bias pad 160 coupled with the first ends 120 of the first transmission lines 112a-c (e.g., via node 128). A bypass capacitor 164 may be coupled between the bias pad 160 and a ground potential 168 to divert alternating current (AC) signals (e.g., RF signals) away from the bias pad 160. In some embodiments, the bypass capacitor may be coupled to a ground potential (e.g., by one or more vias). The bias pad 160 may be coupled with the RF amplifier that provides the communication signal, and the bias pad 160 may provide a DC bias voltage for the RF amplifier (e.g., for the transistors of the RF amplifier). Accordingly, the transformer 100 may provide an integrated source of the DC bias voltage for the RF amplifier, so that a separate bias circuit is not required.

For example, FIG. 2 illustrates an RF amplifier module 200 in accordance with various embodiments. The RF amplifier module 200 includes a distributed amplifier 204 coupled with a transformer 208. The transformer 208 may be similar to the transformer 100 discussed herein (and/or the transformer 300 shown in FIG. 3 and discussed further below). The RF amplifier module 200 may receive an RF signal (e.g., a microwave frequency signal) at an input terminal 212 and pass an amplified version of the RF signal at an output terminal 216. The output terminal 216 may be coupled with an input terminal 220 of the transformer 208. As discussed herein, the transformer 208 may pass the RF signal from the input terminal 220 to an output terminal 224 of the transformer 208, and may also transform between a first impedance at the input terminal 220 and a second impedance at the output terminal 224. In various embodiments, the second impedance may be higher than the first impedance (e.g., by a factor of four). For example, in one embodiment, the first impedance may be about 12.5 Ohms, and the second impedance may be about 50 Ohms.

In various embodiments, the distributed amplifier 204 may include a plurality of active devices 228. The active devices 228 may include one or more transistors to amplify an RF signal received at an input terminal 232 (e.g., gate terminal) of the active device 228 and pass the amplified RF signal to an output terminal 236 (e.g., drain terminal) of the active device 228. The input terminals 232 of the plurality of active devices 228 may be coupled with a first electrical path 240 (e.g., via a DC-blocking capacitor 244), and the output terminals 236 of the plurality of active devices 228 may be coupled with a second electrical path 248. The first electrical path 240 may include characteristic impedances 252 coupled between the input terminals 232 of the active devices 228, and the second electrical path 248 may include characteristic impedances 256 coupled between the output terminals 236 of the active devices 228.

In various embodiments, as discussed herein, the transformer 208 may generate a DC bias voltage (e.g., a drain bias voltage) that is provided to the active devices 228 to facilitate operation of the active devices 228. For example, referring to FIG. 1A, the DC bias voltage may be provided by a bias pad 160 coupled with the first ends 120 of the first transmission lines 112a-c. Accordingly, a separate bias circuit to generate the DC bias voltage for the distributed amplifier 204 may not be required.

As discussed above, the plurality of pairs of transmission lines 112a-c and 116a-c may be co-planar (e.g., disposed in a same plane). In some embodiments, the plurality of pairs of transmission lines 112a-c and 116a-c may be folded in the plane to allow shorter connections between the transmission lines 112a-c and 116a-c and/or provide a smaller footprint for the transformer 100.

Figure 3:
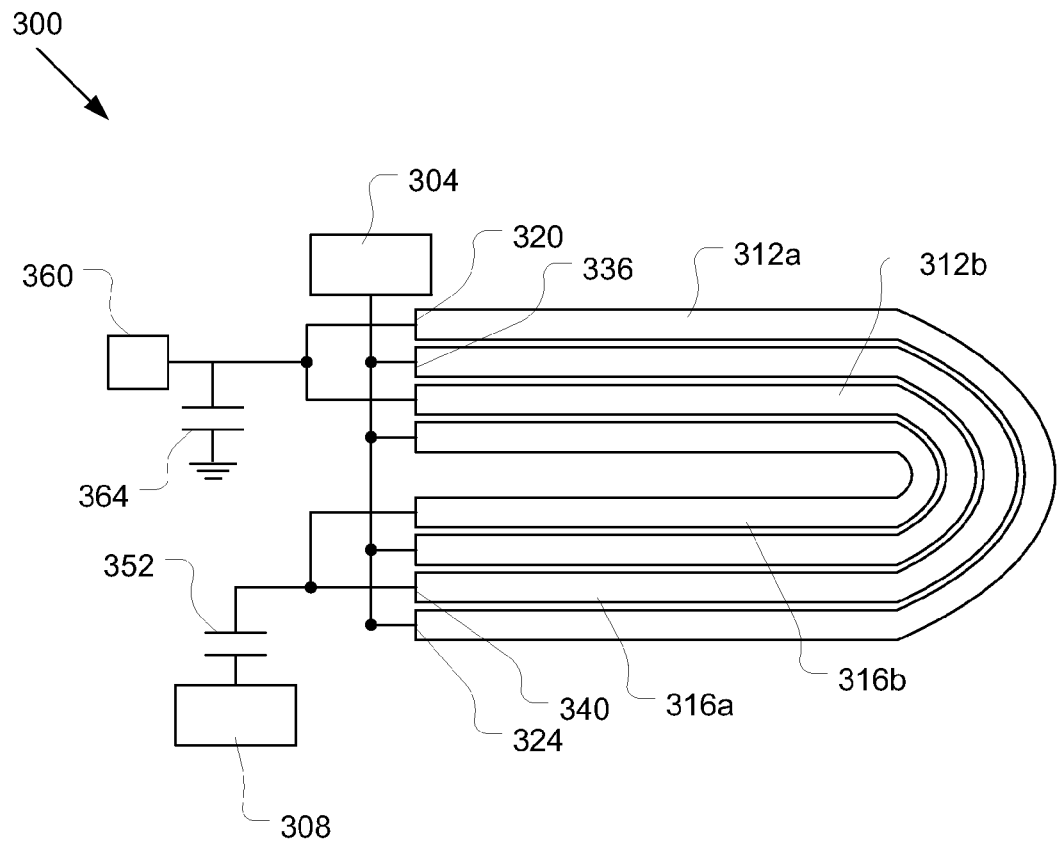
FIG. 3 schematically illustrates a transformer with a plurality of pairs of edge-coupled transmission lines that are folded in a plane, in accordance with various embodiments.

For example, FIG. 3 illustrates a transformer 300 that includes a plurality of pairs of transmission lines that are folded in a plane. The transformer 300 may be a monolithic transformer disposed on a die. Transformer 300 may include an input terminal 304 to receive an RF communication signal (e.g., a microwave frequency communication signal), and an output terminal 308 to pass the RF communication signal to one or more other components (e.g., for transmission over a wireless communication network).

The individual pairs of transmission lines include a first transmission line 312a-b and a second transmission line 316a-b. As shown in FIG. 3, the transmission lines 312a-b and 316a-b are folded in a "U" shape so that ends of the transmission lines are close to one another. In other embodiments, the transmission lines 312a-b may be folded in another suitable shape.

In various embodiments, the first transmission lines 312a-b may include first ends 320 coupled with one another, and second ends 324 coupled with the input terminal 304. The second transmission lines 316a-b may include first ends 336 coupled with the input terminal 304, and second ends 340 coupled with the output terminal 308 (e.g., via a DC-blocking capacitor 352). The transformer 300 may provide a first impedance at the input terminal 304 and a second impedance at the output terminal 308. The second impedance may be greater than the first impedance (e.g., by a factor of four).

In some embodiments, the electrical connections with ends of the transmission lines 312a-b and/or 316a-b may be formed on a different plane from the plane of the transmission lines 312a-b and 316a-b. For example, the electrical connections may be formed by one or more airbridges and/or underpasses.

In some embodiments, a bias pad 360 coupled with the first ends 320 of the first transmission lines 312a-b. The bias pad 360 may provide a DC bias voltage to an RF power amplifier (e.g., amplifier 204). A bypass capacitor 364 may be coupled with the bias pad 360 to divert AC (e.g., RF) signals from the bias pad 360.

Although not shown in FIG. 3, in some embodiments, the transformer 300 may include one or more tuning capacitors (e.g., similar to tuning capacitors 156a-b) coupled with the input terminal 304 to facilitate a high-frequency response of the transformer 300. Additionally, or alternatively, a length of the transmission lines 312a-b and 316a-b may be varied to adjust the frequency response of the transformer 300.

Additionally, although transformer 300 is shown in FIG. 3 with two pairs of edge-coupled transmission lines 312a-b and 316a-b, in other embodiments, transformer 300 may include additional pairs of edge-coupled transmission lines. Additional pairs of edge-coupled transmission lines may be added, for example, to increase the DC current handling of the transformer 300.

Figure 4:
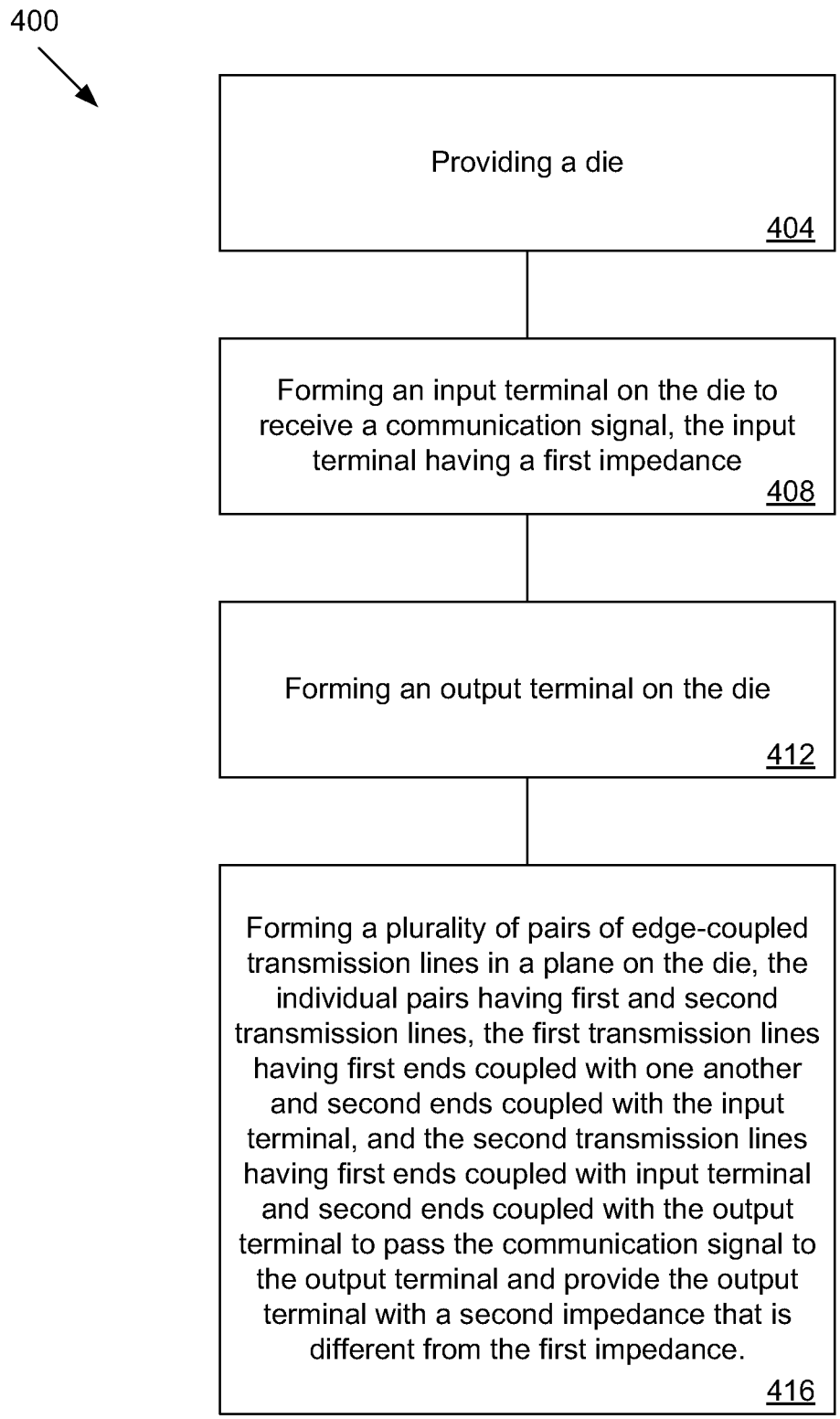
FIG. 4 is a flow diagram of a method of manufacturing a transformer in accordance with various embodiments.

FIG. 4 illustrates a method 400 for manufacturing an MMIC transformer in accordance with various embodiments.

At block 404, the method 400 may include providing a die. In some embodiments, the die may include a GaN substrate.

At block 408, the method 400 may include forming an input terminal (e.g., input terminal 104 or 304) on the die. The input terminal may receive a communication signal (e.g., from an RF amplifier on the die), and may have a first impedance.

At block 412, the method 400 may include forming an output terminal (e.g., output terminal 108 or 308) on the die.

At block 416, the method 400 may include forming a plurality of pairs of edge-coupled transmission lines (e.g., pairs of edge-coupled transmission lines 112a-c and 116a-c or 312a-b and 316a-b) in a plane on the die. The plurality of pairs may be oriented in parallel with one another in the plane. The individual pairs of edge-coupled transmission lines may include first and second transmission lines. The first transmission lines may have first ends coupled with one another and second ends coupled with the input terminal. The second transmission lines may have first ends coupled with the input terminal and second ends coupled with the output terminal to pass the communication signal to the output terminal and provide the output terminal with a second impedance that is different from the first impedance. For example, the second impedance may be greater than the first impedance (e.g., by a factor of four).

In some embodiments, the method 400 may further include forming an RF power amplifier (e.g., distributed amplifier 204) on the die. The RF power amplifier may provide the communication signal to the input terminal of the transformer. In some embodiments, the method 400 may further include coupling the first ends of the first transmission lines to the RF power amplifier to provide a DC bias voltage to the RF power amplifier.

Figure 5:
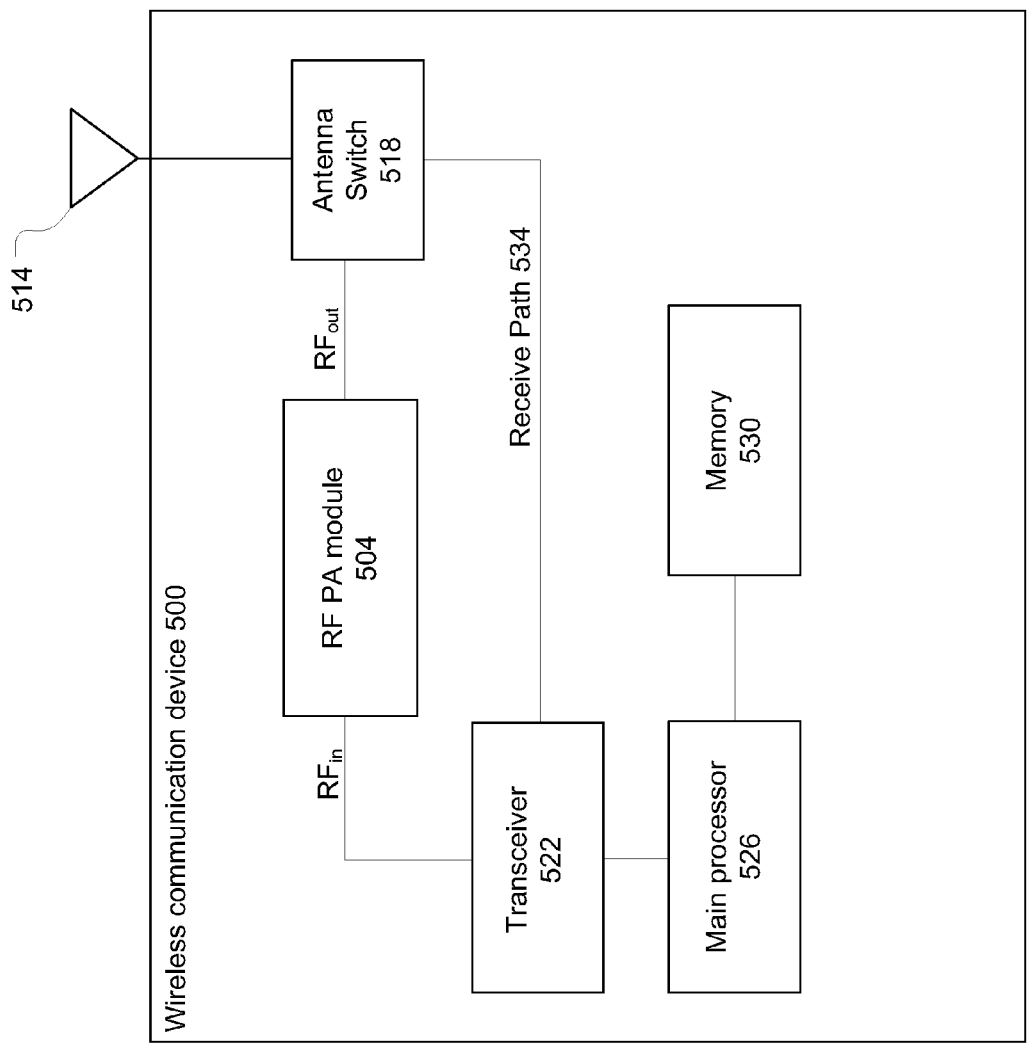
FIG. 5 is a block diagram of an exemplary wireless communication device in accordance with various embodiments.

A block diagram of an exemplary wireless communication device 500 incorporating one or more transformers (e.g., transformer 100, 208, or 300) is illustrated in FIG. 5 in accordance with some embodiments. The wireless communication device 500 may include an RF power amplifier (PA) module 504. The RF PA module 504 may include one or more RF power amplifiers (e.g., distributed amplifier 204) coupled with respective transformers (e.g., transformer 100, 208, or 300).

In addition to the RF PA module 504, the wireless communication device 500 may have an antenna structure 514, an antenna switch 518, a transceiver 522, a main processor 526, and a memory 530 coupled with each other at least as shown. While the wireless communication device 500 is shown with transmitting and receiving capabilities, other embodiments may include devices with only transmitting or only receiving capabilities.

In various embodiments, the wireless communication device 500 may be, but is not limited to, a mobile telephone, a paging device, a personal digital assistant, a text-messaging device, a portable computer, a desktop computer, a base station, a subscriber station, an access point, a radar, a satellite communication device, or any other device capable of wirelessly transmitting/receiving RF signals.

The main processor 526 may execute a basic operating system program, stored in the memory 530, in order to control the overall operation of the wireless communication device 500. For example, the main processor 526 may control the reception of signals and the transmission of signals by transceiver 522. The main processor 526 may be capable of executing other processes and programs resident in the memory 530 and may move data into or out of memory 530, as desired by an executing process.

The transceiver 522 may receive outgoing data (e.g., voice data, web data, e-mail, signaling data, etc.) from the main processor 526, may generate the $RF_{in}$ signal(s) to represent the outgoing data, and provide the $RF_{in}$ signal(s) to the RF PA modules 504. The transceiver 522 may also control the RF PA module 504 to operate in selected bands and in either full-power or backoff-power modes.

The RF PA module 504 may amplify the $RF_{in}$ signal(s) to provide $RF_{out}$ signal(s) as described herein. The $RF_{out}$ signal(s) may be forwarded to the antenna switch 518 and then to the antenna structure 514 for an over-the-air (OTA) transmission. The antenna switch 518 may enable a plurality RF power amplifiers in the RF PA module 504 to transmit using one or more common antennas. In other embodiments, one or more of the RF power amplifiers may be coupled with a dedicated antenna for the individual RF power amplifier. In that case, the antenna switch 518 may not be included and/or the RF PA module 504 may be coupled directly to the antenna structure 514.

The transformer in the RF PA module 504 may present an impedance to the antenna switch 518 and/or antenna structure 514 that is expected by the antenna switch 518 and/or antenna structure 514. The transformer may further allow the RF power amplifier to drive a lower impedance, thereby improving the performance of the RF power amplifier (e.g., allowing increased output power).

In some embodiments, the RF PA module 504 may include a filter (e.g., a duplexer) to suppress spurious emissions such as harmonics and/or noise, and/or to isolate the transmit chain from the receive chain. In these embodiments, the $RF_{out}$ signal(s) may be routed through the filter. The output of each filter may be coupled with the antenna switch 518.

In various embodiments, the transceiver 522 may also receive an incoming OTA signal from the antenna structure 514 via a receive path 534. In some embodiments, the receive path 534 may be separated from the transmit path (e.g., including the $RF_{in}$ and $RF_{out}$ signals) by the antenna switch 518 (e.g., for time division duplex (TDD) systems). In other embodiments, both the transmit and receive signals may be passed through the same arm of the antenna switch, and the receive path 524 may be separated from the transmit path by a duplexer (e.g., for frequency division duplex (FDD) systems). The transceiver 522 may process and send the incoming signal to the main processor 526 for further processing.

In various embodiments, the antenna structure 514 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

Those skilled in the art will recognize that the wireless communication device 500 is given by way of example and that, for simplicity and clarity, only so much of the construction and operation of the wireless communication device 500 as is necessary for an understanding of the embodiments is shown and described. Various embodiments contemplate any suitable component or combination of components performing any suitable tasks in association with wireless communication device 500, according to particular needs. Moreover, it is understood that the wireless communication device 500 should not be construed to limit the types of devices in which embodiments may be implemented.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:
1. An apparatus comprising:
 an input terminal configured to receive a communication signal and to have a first impedance;
 an output terminal; and a plurality of pairs of edge-coupled transmission lines, wherein the individual pairs of edge-coupled transmission lines include first and second transmission lines, and wherein:
the first transmission lines have first ends coupled with one another, and second ends coupled with the input terminal; and
the second transmission lines have first ends coupled with the input terminal and second ends coupled with the output terminal to pass the communication signal to the output terminal and to provide the output terminal with a second impedance that is different from the first impedance.

2. The apparatus of claim 1, wherein the communication signal is provided to the input terminal by a power amplifier, and wherein the first ends of the first transmission lines are coupled to a bias pad to provide a direct current (DC) bias voltage for the power amplifier.

3. The apparatus of claim 2, further comprising a bypass capacitor coupled between the bias pad and a ground potential.

4. The apparatus of claim 1, wherein the plurality of pairs of edge-coupled transmission lines are co-planar in a plane, and wherein the plurality of pairs of edge-coupled transmission lines are folded in the plane.

5. The apparatus of claim 1, further comprising one or more tuning capacitors coupled with the input terminal to facilitate a high-frequency response of the apparatus.

6. The apparatus of claim 1, wherein the apparatus is included in a microwave monolithic integrated circuit (MMIC) on a die.

7. The apparatus of claim 1, wherein a length of the transmission lines is determined based on a frequency range of the communication signal.

8. The apparatus of claim 1, wherein a direct current (DC) current handling of the apparatus is based on a number of the pairs of edge-coupled transmission lines in the apparatus.

9. The apparatus of claim 1, wherein the second impedance is higher than the first impedance.

10. The apparatus of claim 9, wherein the second impedance is four-times higher than the first impedance.

11. A method comprising:
providing a die;
forming an input terminal on the die, the input terminal configured to receive a communication signal and to have a first impedance;
forming an output terminal on the die; and
forming a plurality of pairs of edge-coupled transmission lines in a plane on the die, wherein the plurality of pairs are oriented in parallel to one another, wherein the individual pairs of edge-coupled transmission lines include first and second transmission lines, and wherein:
the first transmission lines have first ends coupled with one another and second ends coupled with the input terminal; and
the second transmission lines have first ends coupled with the input terminal and second ends coupled with the output terminal to pass the communication signal to the output terminal and to provide the output terminal with a second impedance that is different from the first impedance.

12. The method of claim 11, further comprising forming a power amplifier on the die, wherein the power amplifier is configured to provide the communication signal to the input terminal, and wherein the first ends of the first transmission lines are coupled to a bias pad to provide a direct current (DC) bias voltage for the power amplifier.

13. The method of claim 12, further comprising forming a bypass capacitor on the die, the bypass capacitor coupled between the bias pad and a ground potential, and the bypass capacitor coupled with the ground potential by a plurality of vias in the die.

14. The method of claim 11, wherein the plurality of pairs of edge-coupled transmission lines are folded in the plane.

15. The method of claim 11, further comprising forming an airbridge or an underpass in another plane to couple the first ends of the first transmission lines with one another or the first ends of the second transmission lines with one another.

16. A microwave monolithic integrated circuit (MMIC) comprising:
a die;
a radio frequency (RF) amplifier disposed on the die and configured to generate a communication signal having a microwave frequency;
a transformer disposed on the die and including:
an input terminal configured to receive a communication signal and to have a first impedance;
an output terminal;
a plurality of pairs of edge-coupled transmission lines, the plurality of pairs oriented in parallel with one another, wherein the individual pairs of edge-coupled transmission lines include first and second transmission lines configured to pass the communication signal to the output terminal and to provide the output terminal with a second impedance that is greater than the first impedance; and
a bias pad coupled with the first ends of the first transmission lines and the RF amplifier to provide a direct current (DC) bias voltage to the RF amplifier.

17. The MMIC of claim 16, wherein:
the first transmission lines include first ends coupled with one another and second ends coupled with the input terminal; and
the second transmission lines include first ends coupled with the input terminal and second ends coupled with the output terminal to pass the communication signal to the output terminal.

18. The MMIC of claim 16, further comprising a bypass capacitor coupled between the bias pad and a ground potential.

19. The MMIC of claim 16, wherein the plurality of pairs of edge-coupled transmission lines are co-planar in a plane, and wherein the plurality of pairs of edge-coupled transmission lines are folded in the plane.

20. The MMIC of claim 16, further comprising one or more tuning capacitors coupled with the second ends of the first transmission lines and the first ends of the second transmission lines to facilitate a high-frequency response of the transformer.

21. The MMIC of claim 16, wherein the RF amplifier is a distributed amplifier including a plurality of transistors, wherein the plurality of transistors are coupled with the bias pad to receive the DC bias voltage.

22. The MMIC of claim 16, wherein a DC current handling of the transformer is based on a number of the pairs of edge-coupled transmission lines included in the transformer.

* * * * *